United States Patent [19]

Gardner et al.

[11] 4,344,091

[45] Aug. 10, 1982

[54] RANDOM ACCESS MEMORY IMAGING SYSTEM

[75] Inventors: Harry N. Gardner; John P. Petty, both of Colorado Springs, Colo.

[73] Assignee: NCR Corporation, Dayton, Ohio

[21] Appl. No.: 40,009

[22] Filed: May 17, 1979

[51] Int. Cl.³ ............................................... H04N 3/14
[52] U.S. Cl. ................................................... 358/213
[58] Field of Search .......................................... 358/213

[56] References Cited

U.S. PATENT DOCUMENTS

4,011,442  3/1977  Engeler ............................. 358/213

Primary Examiner—Richard Murray
Attorney, Agent, or Firm—J. T. Cavender

[57] ABSTRACT

An image sensing system utilizes a random access memory to provide image sensing and apply random access memory capabilities—data storage, refresh, nondestructive readout, etc.—to binary data representing the two-dimensional image. The random access memory can be used to effect a digital representation of the image or to provide electronic data, e.g., for optical character recognition.

7 Claims, 10 Drawing Figures

RANDOM ACCESS MEMORY IMAGING SYSTEM

BACKGROUND OF THE INVENTION

This invention relates to image detection and to the translation of two-dimensional electromagnetic radiation flux patterns into electrical and other forms.

Image detection technology has been given impetus within the last decade by the rapid development of semiconductor technology. One potential advantage of semiconductor technology is the use of an xy array of closely spaced sensing elements to obtain two-dimensional sensing capability without the need to scan an image.

One example of a two-dimensional xy array of sensing elements is disclosed in U.S. Pat. No. 3,465,293 issued Sept. 2, 1969. The patent discloses an image detector in which a row by column array of photodetectors are connected in series with and modulate the current provided by a corresponding array of MOSFETs. The current amplitude of each MOSFET varies with the intensity of light incident upon its associated photodetector.

Two-dimensional sensing arrays are also available which use charge-coupled device (CCD) sensors and for infrared as well as radiation sensing.

Recently, semiconductor image detection has been expanded through the use of conductor-insulator-semiconductor (CIS) capacitors as sensing elements to provide transient storage of the analog of electromagnetic radiation. An example of CIS capacitive sensing elements is disclosed in U.S. Pat. No. 3,781,827 issued Dec. 25, 1973. This patent discloses a row-by-column array of two transistor-one capacitor sensing cells. The field plate of each capacitor is connected to the drain of an associated FET, which controls charging of the capacitor. When the array is subjected to radiation of the appropriate wavelength, the charge is degraded by minority carriers generated within the semiconductor, thus changing the voltage associated with the field plate. The field plate is connected as the gate of the second FET so that the change in gate voltage is translated as a change in current of the second FET. This current change is thus a measure of the integrated electromagnetic flux incident upon the semiconductor substrate after the initial charging of the capacitor.

The emphasis of semiconductor technology on decreasing the surface area and the number of elements necessary to perform a particular function is reflected in the simplification of image detection elements. U.S. Pat. No. 3,906,544 issued Sept. 16, 1975 to Engler and Tiemann uses a one capacitor-one transfer gate detector-storage element and is believed to represent the current state of imaging art.

The CIS capacitive storage element in U.S. Pat. No. 3,906,544 includes a charge storage region, a charge transfer region and a charge receive region. Charges generated proportional to incident electromagnetic radiation are stored at the charge storage region at the substrate surfaces adjacent the capacitor gate. Transfer gates, associated one to a storage element, control the transfer of charge from selected storage elements to an output circuit for use as a video signal, while holding and integrating other electrical charges in their storage elements. Transfer of charge is along the substrate surface via a depletion region associated with a conductor or a diffused region. The sensitivity of the array can be controlled by adjusting the charge integration time. Apparently, the video signal is proportional to the amount of charge, i.e., to the incident radiation.

Despite the advantages resulting from application of semiconductor technology, this exemplary art indicates that the utility of semiconductor image detectors is limited by destructive readout (DRO). That is, once a cell is read out, the information is effectively destroyed. Also, there is no capability for information processing such as error correction.

SUMMARY OF THE INVENTION

Accordingly, one object of the present invention is to provide an image sensing system having nondestructive readout (NDRO) capabilities.

It is a further object to provide an image sensing system having the ability to store sensed information indefinitely and the ability to selectively edit stored information.

These and other aims are provided by using a random access memory as the two-dimensional sensing array. The random access memory provides NDRO, refresh of stored data, and the ability to selectively edit the stored data. Additionally, the random access memory can be used as both imager and RAM memory by strobing in electromagnetic information and functioning as an imager at one point in time and acting in the usual RAM memory mode at another time. The RAM provides the capability for applying the image information to various uses such as video displays, optical character recognition, etc.

DETAILED DESCRIPTION OF THE PREFERRED EMBODIMENT

Figure 1:
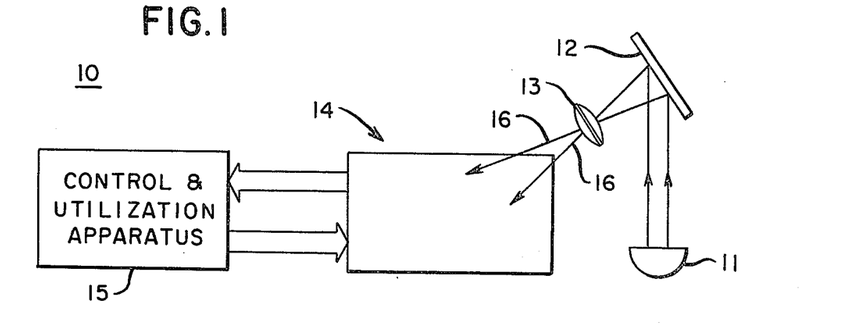
FIG. 1 is a simplified schematic diagram of a random access memory imaging system embodying the principles of the present invention.

FIG. 1 is a simplified schematic diagram of an imaging system 10 which embodies the present invention. Electromagnetic radiation from a source 11 such as an incandescent light bulb is reflected from target image 12 and focused via lens 13 onto a two-dimensional array 14 of image sensors. Operation of the sensor array 14 and utilization of the signal information generated by incident rays 16 to form a video pattern, provide electrical character recognition, etc. is via control/utilization apparatus 15, which is described more fully subsequently.

The structural and physical arrangement of the sensing array 14 is critical to the aim of refreshing, editing, reading and otherwise processing the electromagnetic information provided by the incident radiation 16—16. In a preferred embodiment, the sensing array 14 is a conductor-insulator-semiconductor (CIS) dynamic random access memory (RAM).

Figure 2A:
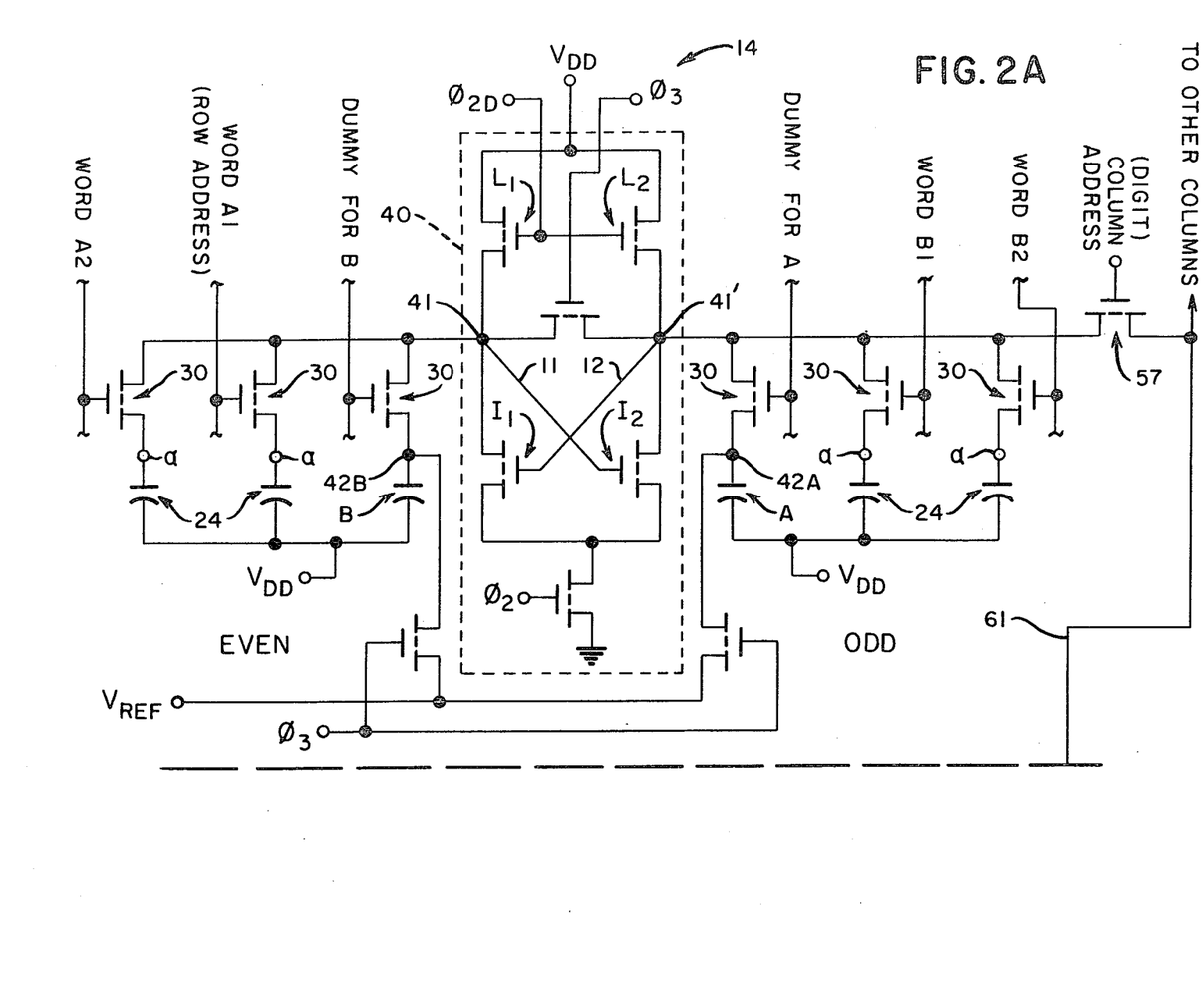
FIGS. 2A and 2B comprise a simplified schematic of a random access memory used in the imaging system of FIG. 1.
Figure 2B:
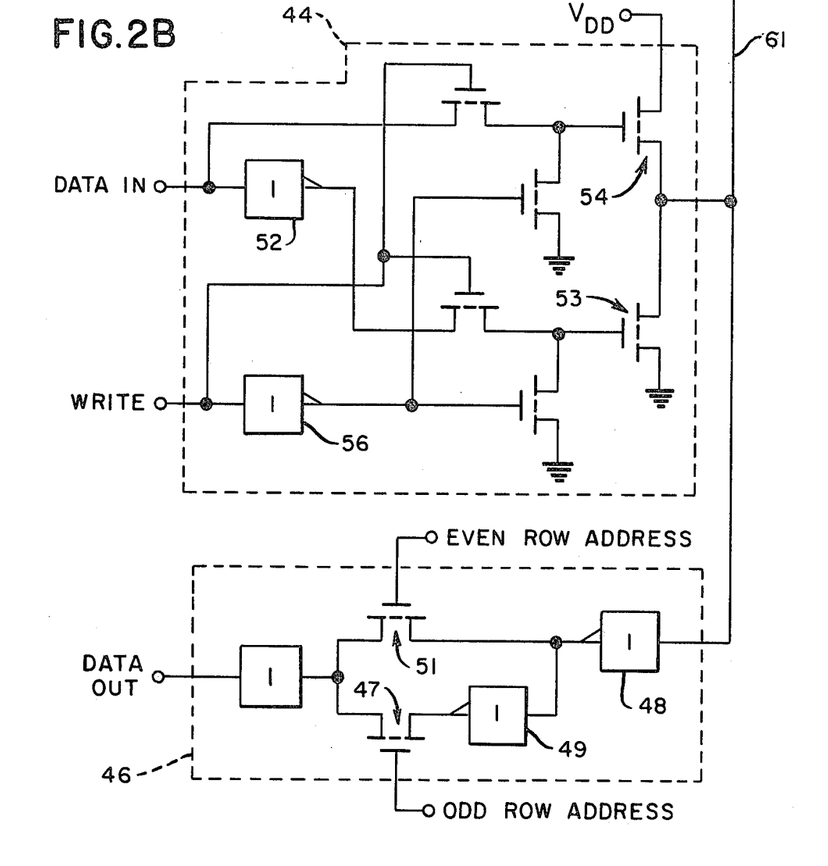
Figure 3:
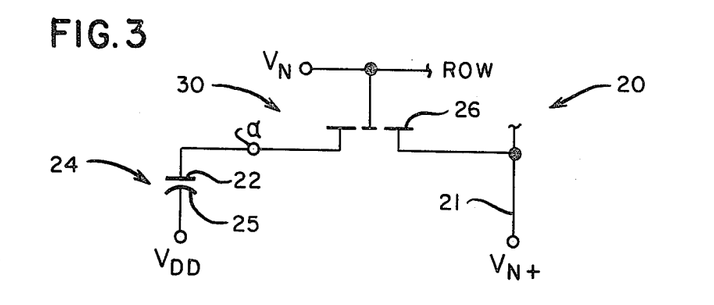
FIG. 3 is a schematic view of the memory cell of the random access memory of FIG. 2.
Figure 4:
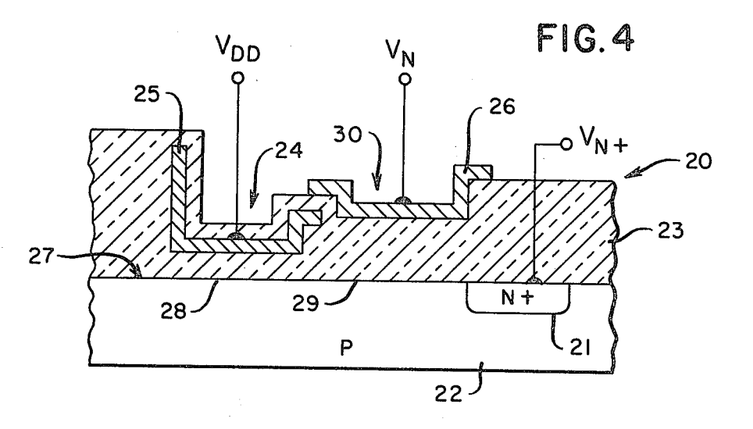
FIG. 4 is a cross-sectional representation of the memory cell of the random access memory of FIG. 2.

Referring to the simplified RAM schematic shown in FIG. 2 (2A and 2B) and preferably to the schematic and cross-sectional views shown in FIGS. 3 and 4, respectively, the basic CIS dynamic RAM memory cell 20 comprises diffusion line 21 formed in semiconductor substrate 22 (illustratively, p-type), insulating layer 23 such as silicon dioxide, storage capacitor 24 including gate electrode 25, and transistor 30 having gate 26. The operation of the cell 20 during image sensing and storage is explained with reference to the cross-sectional diagram of FIG. 4 and the associated surface potential diagrams of FIG. 5 for the interface surface 27 of the substrate 22. To aid the reader, we will first develop the expression for surface potential, $\phi_s$, and the values of $\phi_s$ which apply during operation of the cell.

A one-dimensional expression for the surface potential, $\phi_s$, in terms of interface charge, $Q_s$, and the gate potential, $V_g$, can be obtained by simultaneously solving the basic MIS capacitor equations (1), (2), (3) shown in Table I. These equations are taken from A. S. Grove, *Physics and Technology of Semiconductor Devices*, John Wiley & Sons, Inc., New York, 1967, Chapter 9. By eliminating $x_d$ and $Q_s$ from the equations, one obtains $\phi_s$ in terms of a quadratic in $V_g$ and $Q_n$. Solving the quadratic provides the equation (4) for surface potential.

To obtain numerical values for $\phi_s$, values for B and $C_o$ in equations (5) and (6) are first determined using the exemplary parameters shown in Table II. The values $C_o$ and B are given for both an exemplary 950 Angstrom-thick capacitor gate silicon dioxide and an exemplary 2,000 Angstrom-thick transfer gate silicon dioxide.

Then, these values are used in equation (4) for $Q_N \approx 0$ to obtain the deep depletion surface potential of the substrate 27 beneath the capacitor gate 25 (at region 28, FIG. 4) and the transfer gate 26 (region 29, FIG. 4) over a range of gate voltages which correspond to the voltages used during operation of the cell 20.

Figure 5A:
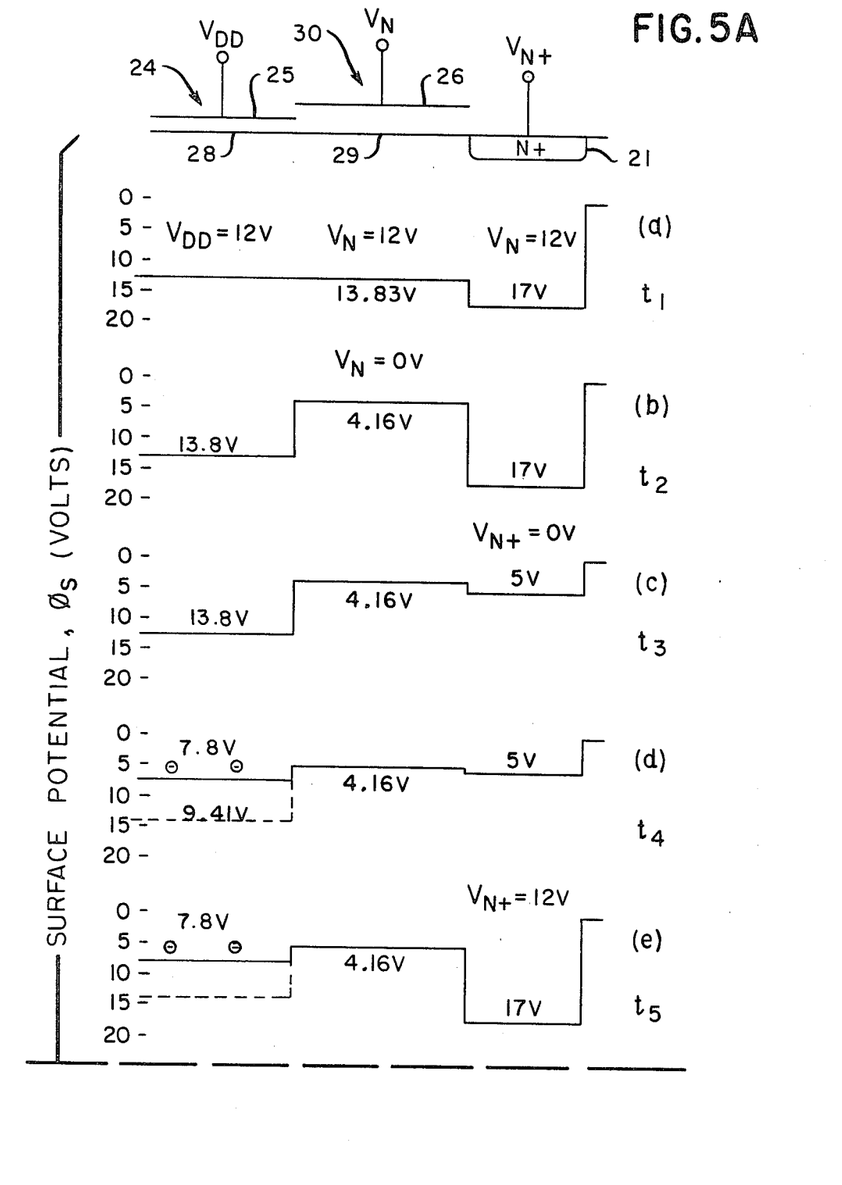
FIG. 5 is a representation of the surface potentials associated with the operation of the memory cell of FIGS. 3 and 4.

Referring now to FIG. 4 and to FIG. 5(a), to write the cell 20 to the (uncharged) 1 state, at $t_1$ the diffusion line 21, transfer gate 26 and capacitor gate 25 are all driven high ($V_{N+}=V_N=V_{DD}=12$ v.) to set the capacitor region 28 surface potential to approximately 13.83 volts (referenced to $V_{BB}$). Note, as used throughout, the supply voltage $V_{DD}$ equals 12 volts, $V_N$ equals 12 volts (high) or 0 volts (low), $V_{N+}$ equals 12 volts (high) or 0 volts (low) and the substrate bias voltage $V_{BB}$ equals $-5$ volts. The Table II potential of $V_g$, which is used to calculate the capacitor 24 and transistor 30 surface potentials of FIG. 5, and the potential of diffusion line 21 of FIG. 5 are both referenced to $V_{BB}$. For example, for $V_{N+}=12$ v., the diffusion line 21 is at 17 volts relative to $V_{BB}=-5$ v.

Figure 5B:
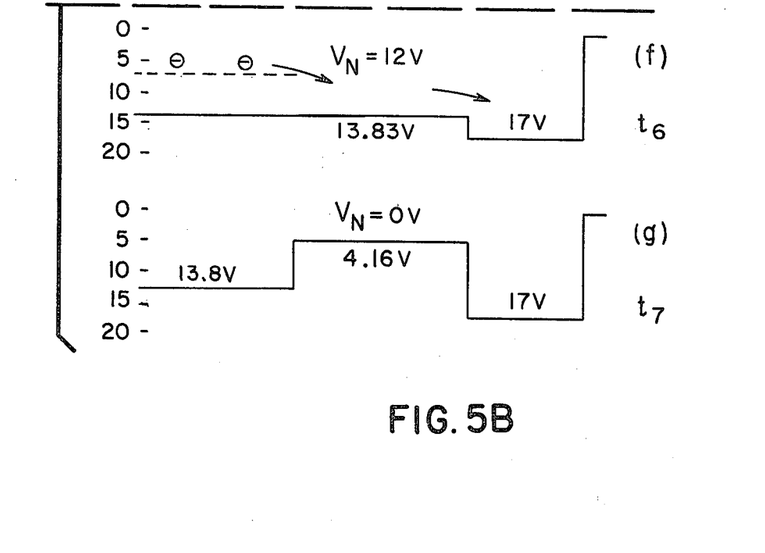

Then, at $t_2$, FIG. 5(b), the transfer gate 26 is driven low to isolate the capacitor 24 from the diffusion line 21, and at $t_3$, FIG. 5(c), the diffusion line 21 may then be driven low.

When the cell 20 is exposed to radiation, for example, using the system shown in FIG. 1, minority carriers (here electrons $Q_N$ for the p-type substrate 22) provided by electron-hole pair generation are attracted to the high-potential capacitor region 28 and degrade the region towards a low voltage, 0 state. FIG. 5(d) shows the condition of the cell after exposure to electromagnetic radiation for sufficient time to raise the potential of capacitor surface region 28 approximately 6 volts, to about 7.8 volts.

To refresh the cell to a 1 state, and referring to FIGS. 5(e) and 5(f), at $t_5$ and $t_6$ the diffusion line 21 and the transfer gate 26 are driven high to sweep the mobile minority carriers to the relatively high, 17 volt potential of the diffusion line. Depending upon the amount of time allowed for this charge transfer and the temperature, substantially all of the charge will be swept back into the diffusion, restoring the surface potential of the storage capacitor to approximately 13.8 volts.

Next, as shown in FIG. 5(g) at $t_7$ the transfer gate 26 is driven low to again isolate the capacitor.

If, instead, a 0 is to be written and refreshed, the same timing sequence applies, except that the diffusion line 21 is held low throughout the cycle. The diffusion line thus acts as a source of electrons, reversing the flow shown at time $t_6$, and restoring the capacitor surface potential to the low, 0 state.

TABLE I $$V_g - V_{FB} = -Q_s/C_o + \phi_s \quad (1)$$
$$\phi_s = (qN_A x_d^2)/(2K_s\epsilon_o) \quad (2)$$
$$Q_s = Q_N - qN_A x_d \quad (3)$$

where  $V_g$ = gate voltage
$V_{FB}$ = flat band voltage
$Q_s$ = substrate charge per unit area
$\phi_s$ = substrate surface potential
q = electronic charge, $1.6 \times 10^{-19}$ coul.
$N_A$ = acceptor impurity concentration
$x_d$ = depletion region width
$K_s$ = substrate dielectric constant
$\epsilon_o$ = permittivity of free space, $8.86 \times 10^{-14}$ F/cm
$Q_N$ = inversion layer electronic charge per unit area Solving (1), (2), (3) provides:

$$\phi_s = \frac{Q_N}{C_o} + V_g - V_{FB} + \frac{B}{C_o} - \frac{B}{C_o}\left[1 + \frac{2C_o}{B}\left(V_g - V_{FB} + \frac{Q_N}{C_o}\right)\right]^{\frac{1}{2}} \quad (4)$$

where $B = \dfrac{K_s q N_A t_{ox}}{K_{ox}}$  (5)

$K_{ox}$ = oxide dielectric constant
$t_{ox}$ = oxide thickness and $C = \dfrac{\epsilon_o K_{ox}}{t_{ox}}$.  (6)

TABLE II

Parameters
$\rho = 7-9$ ohm-cm
$N_A$ (8 ohm-cm) = $1.74 \times 10^{15}$ cm$^{-3}$
$t_{ox}$ (cap.) + 950 A°
$t_{ox}$ ($T_x$) = 2000 A°
$V_{FB}$ (950 A°) ~ $-1$v.
$V_{FB}$ (2000 A°) ~ $-2$v.
$K_s = 11.7$
$K_{ox} = 3.9$
$\epsilon_o = 8.86 \times 10^{-14}$ F/cm$^1$ Associated Values
$C_o$ (950 A°) = $3.64 \times 10^{-8}$ F/cm$^2$
$C_o$ (2000 A°) = $1.73 \times 10^{-8}$ F/cm$^2$
B (950 A°) = $7.93 \times 10^{-9}$ coul/cm$^2$ TABLE II-continued B (2000 A°) = 1.67 × 10⁻⁸ coul/cm²

TABLE III

| | | Surface Potential[1] (Deep Depletion $Q_N \to 0$) | | |
|---|---|---|---|---|
| $V_g - V_{FB}$ (volts) | $V_g$(950A°) (volts) | $V_g$(2000A°) (volts) | $\phi_s$(950A°) (volts) | $\phi_s$(2000A°) (volts) |
| 6 | 5 | 4 | 4.59 | 3.43 |
| 7 | 6 | 5 | 5.46 | 4.16 |
| 8 | 7 | 6 | 6.34 | 4.92 |
| 9 | 8 | 7 | 7.22 | 5.68 |
| 10 | 9 | 8 | 8.12 | 6.46 |
| 11 | 10 | 9 | 9.02 | 7.25 |
| 12 | 11 | 10 | 9.92 | 8.05 |
| 13 | 12 | 11 | 10.83 | 8.86 |
| 14 | 13 | 12 | 11.74 | 9.67 |
| 15 | 14 | 13 | 12.65 | 10.50 |
| 16 | 15 | 14 | 13.57 | 11.32 |
| 17 | 16 | 15 | 14.49 | 12.15 |
| 18 | 17 | 16 | 15.41 | 12.99 |
| 19 | 18 | 17 | 16.33 | 13.83 |
| 20 | 19 | 18 | 17.26 | 14.67 |

[1]Note - surface potential $\phi_s$ is calculated from equation (4) using the associated values for B and $C_o$ from TABLE II.

Figure 7:
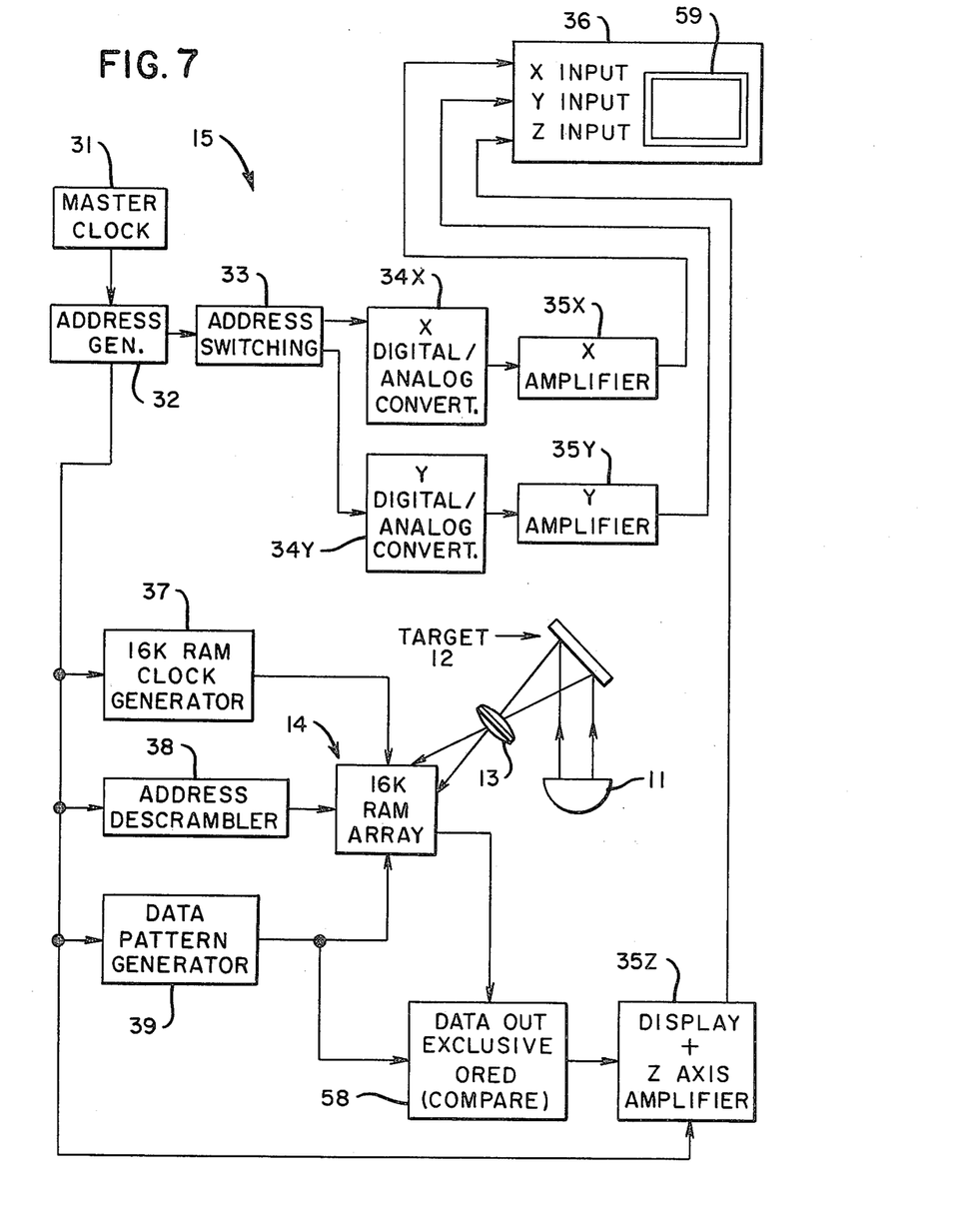
FIG. 7 is an expanded block diagram of the imaging system shown in FIG. 1.
Figure 8:
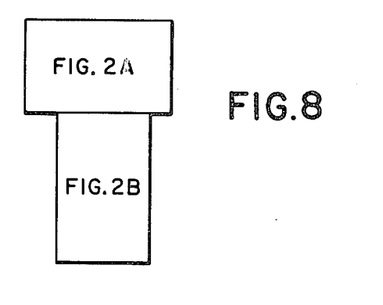
FIG. 8 indicates the relative orientation of FIG. 2A and FIG. 2B.

Referring to FIG. 2, there is shown a simplified schematic of a random access memory (RAM) which employs the memory storage cell shown in FIGS. 3-5 and which may be used as the memory 14 shown in FIGS. 1 and 7. The illustrated RAM is the type discussed in Stein et al., "Storage Array and Sense/Refresh Circuit for Single Transistor Memory Cells"; IEEE Journal of Solid State Circuits; Vol. SC-8, No. 5; October, 1973; pp. 298-305, which is incorporated by reference. The FIG. 2 simplified schematic shows a portion of a row of each cell matrix A and B of an mxn row by column array. This conventional arrangement, in which separate cell matrices are physically separated by associated circuits such as the sense amplifier 40, normally limits imaging to one of the matrices, because it would be difficult if not impossible to focus an image on the physically-separated matrices.

Figure 6:
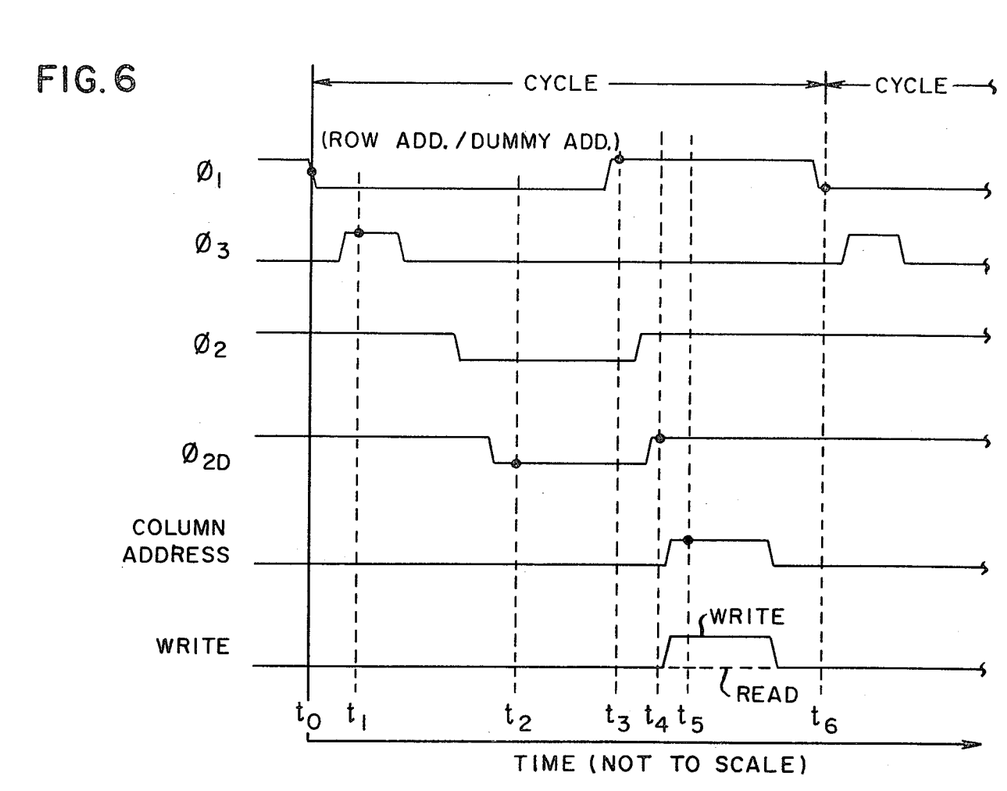
FIG. 6 is a simplified timing diagram for the random access memory of FIG. 2.

To illustrate operation of the RAM 14, consider read, read modified write, and refresh cycles. Referring also to the simplified timing diagram for a typical operating cycle shown in FIG. 6, at $t=t_0$, the row (word) addresses are low (at ground). At $t=t_1$, the precharge clock $\phi_3$ turns on. The load transistors $L_1$ and $L_2$ of sense amplifier 40 are of high impedance; the input transistors $I_1$ and $I_2$ are of low impedance. Thus, with clocks $\phi_2$ and $\phi_{2D}$ on, when precharge clock $\phi_3$ turns on, nodes 41 and 41' of sense amplifier 40 are equalized at ground (approximately). ($V_{ref}$ and $V_{DD}$, which are not shown in FIG. 6, are always on.) Precharge clock $\phi_3$ also sets the nodes 42A and 42B associated with the dummy capacitors A and B to $V_{ref}$. Here, $V_{ref}$ is between the 0 (low) and 1 (high) states, for example, at 6 volts.

At $t=t_2$, precharge clock $\phi_3$ and power clocks $\phi_2$ and $\phi_{2D}$ are turned off.

At $t=t_3$, a row address and the opposite side dummy are turned on (for example word $A_1$ and dummy A) and information in the associated row storage capacitor 24 and the opposite side dummy capacitor A are available on amplifier nodes 41 and 41'. At $t=t_4$, the power clocks $\phi_2$ and $\phi_{2D}$ have been turned on to provide amplified information at the nodes 41 and 41'. That is, if the selected capacitor 24 is in a charged, 0 state, associated node a is low, and the node 42A for the associated dummy capacitor A is higher, at about 6 volts. As a result, the capacitances associated with cross-connect lines 11 and 12 are charged, with line 11 (associated with dummy capacitor A) being charged faster than line 12 (associated with the lower potential of node a). Consequently, line 11 is charged and turns on transistor $I_1$ before $I_2$ can be turned on. $I_1$ connects node 41 to ground, thereby preventing $I_2$ from turning on, and permits node 41' to become fully charged to $V_{DD}$. In short, in response to the low potential, 0 state on the capacitor 24 associated with even word $A_1$, node 41 is placed at 0 and node 41' is placed at an amplified (and inverted) 1 state. Conversely, if $A_1$ capacitor 24 or any of the other even matrix capacitors is initially in a 1 state, a 1 (0) is applied to node 41 (41').

The same type of sequence applies to the storage capacitors of the odd matrix. Thus, information in the odd matrix capacitors is applied without inversion to the adjacent node, 41', and is applied in inverted form to the other node, 41. For example, a 1 on node a of word $B_1$ capacitor 24 results in an amplified 1 at node 41' and a 0 at node 41. It should be noted that the data out is taken from node 41', so that the information from the even matrix capacitors is taken in inverted form, while the information from the odd matrix capacitors is taken in non-inverted form.

At $t=t_5$, the column address turns on transistor 57 to access the information at node 41'. To implement a read cycle, no write pulse is provided to the inverter 56 of the gate and level shifter circuit 44, so that this circuit is effectively disconnected from line 57 and the amplified information on sense amplifier node 41' is available on the data out buffer 46. Because the information from the even matrix storage capacitors is provided inverted at node 41', and the information in the odd storage matrix capacitors is applied to node 41' without inversion, inversion is applied to provide non-inverted data out. That is, depending upon whether information is being read out from an even or an odd storage capacitor, the even row address accesses transistor 51 so that inverter 45 inverts the amplified information at node 41' once, or the odd row address accesses transistor 47 so that inverters 48 and 49 invert the node 41' information twice, both to provide non-inverted data out.

At $t=t_6$, all clocks return to their original state, preparatory to the next cycle. As the row access transistor 30 turns off, the amplified information on node 41 (41') is isolated on the even (odd) storage capacitor 24.

To apply a read modify write cycle instead of the above read only cycle, at $t=t_5$ a write pulse is applied to inverter 56 and a data in pulse is applied to inverter 52 of the circuit 44. The transistor drive available from the write inverter 53, 54 forces a 0 or 1 onto sense amplifier 40 depending upon whether the TTL data in applied to inverter 56 is 0 or 1. In this read modified write cycle, the data out represents that data written in.

In a refresh only cycle, it is not necessary to turn on column address transistor 57 at $t=t_5$. Instead, at $t=t_6$, the amplified information available at $t=t_4$ on nodes 41 and 41' is returned to the corresponding even or odd matrix storage cell, and is isolated in the cell as the associated row address transistor 30 turns off. As those skilled in the art will appreciate, all memory cycles start with cell read-out and function to refresh the stored information.

FIG. 7 is a block diagram of an imaging system 10 which was used to demonstrate random access memory imaging. The memory 14 was a 16K RAM, Model 4116 manufactured by Mostek Corporation, 1215 West Crosby Road, Carrolton, Tex., 75006. The control and utilization system 15 was used to write each cell of the RAM array 14 to a 1. Then, radiation from source 11 such as an incandescent light bulb and reflector was reflected from target 12 (illustratively, an orange and black instruction manual cover) and focused by the 10X lens 13 onto one matrix of the two matrix RAM array. The circuit 15 was used to display an image of the target 12 at screen 59 of monitor 36.

The monitor 36 was a Tektronix Model 604, from Tektronix, Inc., 14150 Southwest Karl Braun Dr., Beaverton, Ore., 97077. The Model 604 is well-suited for use in conjunction with 16K RAM imaging because its X, Y and Z axes have the necessary band width to work in conjunction with the speed of the 16K RAM (approximately 2 MHz). The X and Y inputs of the monitor were each driven by high-speed AD518 operational amplifiers, denoted 35X and 35Y in FIG. 7. Each of the 16,384 addresses associated with the 16K RAM array 14 were represented by a distinct location on the screen of the monitor 36 in a 128×128 square pattern.

A conventional master clock 31 was used to synchronize the logic of address generator 32, 16K RAM clock generator 37, address descrambler 38, data pattern generator 39, and Z axis amplifier 35Z.

Addressing for the monitor 36 and the RAM 14 was provided by the address generator 32. This generator comprised four four-bit binary counters which operate synchronously to provide an upward count from 0 to 16,384. This binary count provided the addresses necessary to access every storage cell in the array.

The clock generator 37 was a conventional circuit comprising SN74123 single-shot TTL multivibrators and generated all the signals necessary to operate a 16K dynamic RAM: data in, write/read, $\overline{RAS}$, and $\overline{CAS}$. As used here in 16K RAM imaging, the signals were set to write all 1's into the RAM array.

Data pattern generator 39 was a conventional circuit which developed the data pattern which (1) was used to initialize the 16K RAM 14, i.e., to write the RAM array before the image was flashed on the cell array and (2) was compared to the data emanating from the 16K RAM. As mentioned, the pattern comprises 1's at each address location. Data out EXCLUSIVE-ORED circuit 58 performed an EXCLUSIVE OR function on the pattern from generator 39 and the data emanating from the 16K RAM 14. The EXCLUSIVE OR truth table is shown below.

| GENERATOR PATTERN | RAM DATA OUT | EXCLUSIVE OR CIRCUIT 39 OUTPUT |
|---|---|---|
| 1 | 1 | 0 |
| 1 | 0 | 1 |
| 0 | 1 | 1 |
| 0 | 0 | 0 |

Only the first two combinations are utilized for a pattern entirely of 1's. When the data are equal (RAM data out is 1), a low level is strobed into the Z axis amplifier 35Z; when the data do not match (RAM data out is 0) a high level is strobed.

The Z axis amplifier circuit 35Z amplified the positive going pulse from the data out EXCLUSIVE-ORED circuit 58 and applied the amplified signal to the Z axis input of the monitor 36. As a result, when the data out EXCLUSIVE-ORED circuit 58 was used to compare a 1 pattern from the generator circuit 37 with an image pattern which had been read out of the RAM, a lighted dot was produced at the display address corresponding to each cell location that had been degraded by light to a 0 level, thereby producing a digital representation of the target 12.

Alternatively, the output of the random access memory could be applied directly to the Z axis amplifier and the output synchronized with the monitor addressing, to effect the display image.

The 16K RAM control apparatus also included an address descrambler 38, which was required because the physical bit positions of the exemplary RAM 14 do not follow an organized sequential addressing scheme. Thus, if a visual image were reproduced using a sequential addressing technique, the data from the RAM would produce a scrambled monitor image. The address descrambler 38 comprised two groups of EXCLUSIVE OR gates which acted as a row descrambler and a column descrambler, respectively, to descramble the sequential address so that the internal 16K RAM bit positions corresponded to the monitor bit positions. Two SN74157 data selectors/multiplexers were used to select the row address bits and the column address bits.

Addressing the monitor 36 was done by address switching circuit 33 under the control of the address generator 32. Address switching circuit 33 comprised TTL data selectors which provided the correct binary count (binary address) to digital-to-analog converters 34X and 34Y so the correct electron beam position was provided in the monitor for the particular address mode. (The exemplary circuit provided for the two addressing modes right to left, bottom to top or bottom to left, left to right). The digital-to-analog converters 34X and 34Y comprised one AD559 converter per axis for changing the binary address received from the address switching circuit 33 to an analog voltage, which was applied to the X and Y amplifiers 35X and 35Y for amplification and transfer to the monitor 36. The analog voltage corresponding to the two parts (row and column) of the binary address drove the pattern-generating electron beam of the monitor to a position corresponding to the location of the addressed cell within the 16K RAM array 14. Because the amplified pulses from amplifier 35Z effected application of dot/no dot for light-/dark target areas, the combination of the X, Y and Z inputs effected a digital representation of the target.

To summarize the use of the exemplary RAM imaging system 15, first, under the control of the address generator 32, the 16K RAM clock generator circuit 37 and the data pattern generator circuit 39 effect writing of all cells in the array (or in one matrix of the array) to 1's. That is, all capacitors 24 have their surface potentials set high through the access transistors 30. The surface of the RAM array 14 is then exposed to electromagnetic radiation such as the reflected radiation from target 12. Without exposure to radiation, the high surface potential would degrade normally and, if no memory cycles—read, write, refresh—were interspersed, all the storage capacitors would eventually be discharged.

However, lens 13 focuses the image on the RAM surface and thereby concentrates and accelerates the imaging pickup. Dark areas or colors (of an image such as a picture, universal product code, etc.) reflect less light than lighter areas so that a light-dark pattern will be focused on the RAM surface. Data out EXCLU- SIVE-ORED circuit 58 compares the RAM data with the data from generator 39 and provides binary pulses to the Z amplifier circuit 35Z. The address circuits, and X, Y and Z amplifiers control transfer of this binary 0/1, light/dark information to monitor screen addresses corresponding physically to the RAM addresses to reproduce the image.

The degradation time can be controlled by adjusting the reference voltage level, $V_{ref}$, the radiation intensity, lens magnification, exposure time, $V_{DD}$ power supply, and the temperature.

Those skilled in the art will appreciate that the RAM imaging system can be readily modified to provide automatic synchronized operation, including initializing the RAM, initiating and chopping the imaging radiation, and reading the stored image information.

The use of a random access memory as the imaging device permits performing normal memory cycles—read, write, refresh—on the image information. Editing or correction of the image information may be readily done. In short, use of a random access memory as the imaging array permits application of the versatile RAM functions and uses to the image information. In addition to visual display of the image information, the image information in the RAM might be used in optical character recognition systems, etc. For example, the RAM output could be applied to a hard-wired logic unit for performing optical character recognition.

Having described a preferred embodiment of a RAM imaging system, what is claimed is:

1. In a solid state imaging system of the type including means for sensing incident radiation and responsively supplying electrical signals controlled by the incident radiation, and means for utilizing the controlled electrical signals, the improvement wherein the sensing means is a random access memory for providing digital electrical signals controlled by a threshold value of incident radiation and comprising a digital data pattern of the incident radiation.

2. The improved imaging system of claim 1 wherein the utilizing means comprises a video display responsive to the digital electrical signals for providing a visual image of the object.

3. The improved imaging system of claim 2, further comprising:
   means for addressing said display means and said random access memory;
   means for coordinating the physical location of the addresses of said display means and said random access memory; and wherein
   said visual image comprises a pattern of on/off states at each of said display means addresses.

4. The improved imaging system of claim 2 wherein said random access memory comprises an array of charge storage elements, and further comprising:
   means for initializing said random access memory by writing a predetermined data pattern into said random access memory to selectively charge said charge storage elements, each to a predetermined binary state; and
   comparison means communicating with said data pattern writing means and said random access memory for performing an exclusive or function on the initializing data pattern and the data pattern of the incident radiation for providing electrical signals controlling the binary state of each said display means addresses.

5. A solid state imaging system comprising:
   means (36) for providing a video display controlled by two-dimensional address signals and image data signals associated with the individual addresses;
   a random access memory (14) including an array of charge storage elements (24), each for storing digital electrical charge representing a binary state, the binary charge storage state being altered in response to incident electromagnetic radiation of a predetermined threshold value for providing output signals representing the binary charge storage state, and means (40) for selectively refreshing the binary charge storage state;
   means (32) for selectively and sequentially generating addresses for said display means and said random access memory;
   means (37) responsive to the addresses for supplying operational signals to said random access memory;
   means (33, 34, 35X and 35Y) responsive to the addresses for providing the two-dimensional address information to said display means;
   means (39) responsive to the addresses for initializing said random access memory prior to irradiation thereof by writing said charge storage elements to a predetermined pattern of binary charge storage states;
   comparison means (58) responsive to said initializing means and said random access means for comparing the initialized binary charge storage state of said charge storage elements with the binary charge storage state thereof after irradiation for providing an output signal representing an exclusive or function of the compared binary charge storage states; and wherein
   amplifier means (35Z) responsive to the output signals from said comparison means for providing the image data signals to said display means.

6. A solid state imaging system comprising:
   means (36) for providing a video display controlled by two-dimensional address signals and image data signals associated with the individual addresses;
   a random access memory (14) including an array of charge storage elements (24), each for storing digital electrical charge representing a binary state, the binary charge storage state being altered in response to incident electromagnetic radiation of a predetermined threshold value for providing output signals representing the binary charge storage state, and means (40) for selectively refreshing the binary charge storage state;
   means (32) for selectively and sequentially generating addresses for said display means and said random access memory;
   means (37) responsive to the addresses for supplying operational signals to said random access memory;
   means (33, 34, 35X and 35Y) responsive to the addresses for providing the two-dimensional address information to said display means;
   means (39) responsive to the addresses for initializing said random access memory prior to irradiation thereof by writing said charge storage elements to a predetermined pattern of binary charge storage states; and
   amplifier means (35Z) responsive to the said random access memory output signals for providing the image data signals to said display means.

7. The imaging system of claim 5 or 6, further comprising address descrambler means (38) for coordinating the physical location of the addresses of said random access memory and said display means.

* * * * *